(12) United States Patent
Xu et al.

(10) Patent No.: US 11,538,891 B2
(45) Date of Patent: Dec. 27, 2022

(54) DISPLAY PANEL HAVING BEZEL AREA INCLUDING LIGHT-EMITTING LAYER OVERLAPPING WIRING LEADS

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Zi Xu, Shanghai (CN); Xinzhao Liu, Shanghai (CN); Liujing Fan, Shanghai (CN)

(73) Assignees: Wuhan Tianma Micro-Electronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 172 days.

(21) Appl. No.: 17/034,584

(22) Filed: Sep. 28, 2020

(65) Prior Publication Data

US 2022/0028951 A1 Jan. 27, 2022

(30) Foreign Application Priority Data

Jul. 23, 2020 (CN) .......................... 202010715993.6

(51) Int. Cl.
*H01L 27/32* (2006.01)
*H01L 51/52* (2006.01)
*H01L 51/50* (2006.01)
*H01L 51/56* (2006.01)

(52) U.S. Cl.
CPC ........ *H01L 27/3276* (2013.01); *H01L 27/323* (2013.01); *H01L 51/5056* (2013.01); *H01L 51/5072* (2013.01); *H01L 51/5092* (2013.01); *H01L 51/5237* (2013.01); *H01L 51/5284* (2013.01); *H01L 51/5293* (2013.01); *H01L 51/56* (2013.01); *H01L 2227/323* (2013.01)

(58) Field of Classification Search
CPC ............... H01L 27/3276; H01L 27/323; H01L 2227/323; H01L 51/5237; H01L 51/5284; H01L 51/5293; H01L 51/5281; H01L 51/56
USPC ......................................................... 257/40
See application file for complete search history.

(56) References Cited

U.S. PATENT DOCUMENTS

| 2016/0181291 | A1* | 6/2016 | Katoh | ............... | G02F 1/136227 257/43 |
| 2017/0345876 | A1* | 11/2017 | Chen, Jr. | ............. | H01L 27/3202 |
| 2022/0165827 | A1* | 5/2022 | Xu | ........................... | G09G 3/20 |

FOREIGN PATENT DOCUMENTS

| CN | 110968219 A | * | 4/2020 |
| CN | 110968219 A | | 4/2020 |

* cited by examiner

*Primary Examiner* — Matthew E. Gordon
(74) *Attorney, Agent, or Firm* — Anova Law Group, PLLC

(57) ABSTRACT

A display panel, a method for fabrication a display panel, and a display device are provided. The display panel includes a display area, and a non-display area surrounding the display area and a first bezel area being in the non-display area; a substrate; a wiring layer, disposed on the substrate and in the non-display area, and including at least one first lead and at least one second lead, and at least a partial line segment of the at least one first lead and at least a partial line segment of the at least one second lead are disposed in the first bezel area; a polarizer disposed on a side of the wiring layer away from the substrate; and a first light-emitting layer, at least distributed in the first bezel area and, along a direction perpendicular to the substrate, disposed between the substrate and the wiring layer.

22 Claims, 8 Drawing Sheets

100

DISPLAY PANEL HAVING BEZEL AREA INCLUDING LIGHT-EMITTING LAYER OVERLAPPING WIRING LEADS

CROSS-REFERENCE TO RELATED APPLICATION

This application claims priority of Chinese Patent Application No. 202010715993.6, filed on Jul. 23, 2020, the entire contents of which are hereby incorporated by reference.

FIELD OF THE DISCLOSURE

The present disclosure generally relates to the field of display technology and, more particularly, relates to a display panel and a method for fabricating a display panel, and a display device.

BACKGROUND

With the continuous development of display technologies, display panels have higher and higher screen-to-body ratios. Full screen display panels have received widespread attentions due to their narrow bezel or even bezel-less display effects. At present, display devices, such as mobile phones and tablet computers, often have multiple signal lines in the bezel area, and the signals transmitted by the signal lines are not the same. Thus, there are voltage differences between the signal lines that transmit different signals; and an electric field will be formed between adjacent signal lines. To match the requirements of a narrow bezel design, the distance between the adjacent signal lines in the bezel area has been reduced.

Usually, the signal lines are metal lines. The material used for the metal lines is very active. When water vapor enters the bezel area, the metal material that forms the signal lines is prone to have an ionized migration under the action of the electric field and the water vapor, resulting in the precipitation of positive metal ions. In some other film layers of the display device, such as the polarizer, when the water vapor invades, negative ions will be precipitated. The positive ions and the negative ions will be combined immediately to synthesize a metal compound. When the metal compound accumulates to a certain extent, it may cause a short circuit issue between the signal lines that have a reduced distance, which affects the normal display function of the display device.

The disclosed display panel, fabrication method and display device are directed to solve one or more problems set forth above and other problems in the art.

BRIEF SUMMARY OF THE DISCLOSURE

One aspect of the present disclosure provides a display panel. The display panel includes a display area, and a non-display area surrounding the display area and a first bezel area being in the non-display area; a substrate; a wiring layer, disposed on the substrate and in the non-display area, and including at least one first lead and at least one second lead, wherein a voltage difference is formed between the at least one first lead and the at least one second lead, and at least a partial line segment of the at least one first lead and at least a partial line segment of the at least one second lead are disposed in the first bezel area; a polarizer disposed on a side of the wiring layer away from the substrate; and a first light-emitting layer, at least distributed in the first bezel area and, along a direction perpendicular to the substrate, disposed between the substrate and the wiring layer.

Another aspect of the present disclosure provides a method for fabricating a display panel. The display panel may include a display area, and a non-display area surrounding the display area and a first bezel area being in the non-display area. The method includes providing a substrate; forming a first light-emitting layer on one side of the substrate and disposed on at least the first bezel area; forming a wiring layer on a side of the first light-emitting layer away from the substrate, wherein the first wring layer includes at least one first lead and at least one second lead, and at least a partial line segment of the at least one first lead and at least a partial line segment of the at least one second lead are disposed on the first bezel area; and attaching a polarizer on a side of the wiring layer away from the substrate.

Another aspect of the present disclosure provides a display device. The display device includes a display panel. The display panel includes a display area, and a non-display area surrounding the display area and a first bezel area being in the non-display area; a substrate; a wiring layer, disposed on the substrate and in the non-display area, and including at least one first lead and at least one second lead, wherein a voltage difference is formed between the at least one first lead and the at least one second lead, and at least a partial line segment of the at least one first lead and at least a partial line segment of the at least one second lead are disposed in the first bezel area; a polarizer disposed on a side of the wiring layer away from the substrate; and a first light-emitting layer, at least distributed in the first bezel area and, along a direction perpendicular to the substrate, disposed between the substrate and the wiring layer.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrating embodiments of the present disclosure, and together with the detailed descriptions serve to explain the mechanism of the present disclosure.

DETAILED DESCRIPTION

Figure 1:
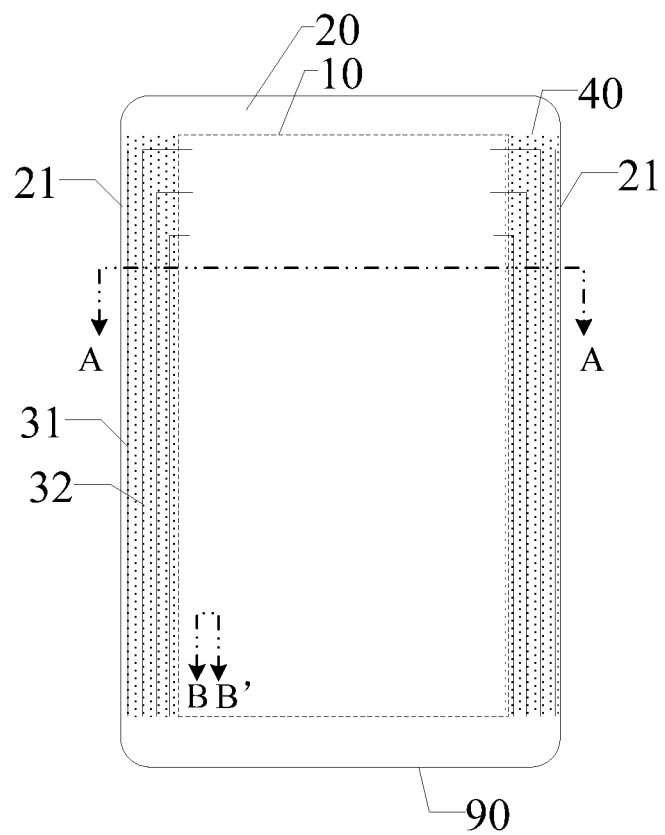
FIG. 1 illustrates a top view of an exemplary display panel consistent with various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined when there are no conflicts.

The following description of at least one exemplary embodiment is actually only illustrative, and in no way serves as any limitation to the present disclosure and its application or use.

The technologies, methods, and equipment known to those of ordinary skill in the relevant fields may not be discussed in detail, but where appropriate, the technologies, methods, and equipment should be regarded as part of the specification.

In all the examples shown and discussed herein, any specific value should be interpreted as merely exemplary and not as limiting. Therefore, other examples of the exemplary embodiment may have different values. It should be noted that similar reference numerals and letters indicate similar items in the following drawings, so once a certain item is defined in one drawing, it does not need to be further discussed in subsequent drawings.

Usually, the signal lines in the display device use metal lines, and the metal lines are made of active metal materials, such as Ag, or Al. Under the action of an electric field and water vapor, the Ag or Al forming the metal lines is prone to have an ionized migration. For example, when the material of Ag is included in the metal lines, sliver ions (Ag+) may be precipitated. When the display device includes a polarizer, especially in wearable products, the size of the polarizer is small, and it is not suitable to be polished. Therefore, the boundary of the polarizer is rough and it is easy to form water vapor intrusion points. When water vapor invades, the iodine ions (I−) in the polarizer will be precipitated, and will form AgI after encountering ionized and migrated Ag+ ions. When AgI accumulates between two adjacent signal lines, it may cause two adjacent signal lines to have a short circuit issue, and the normal display of the display device may be adversely affected.

The present disclosure provides a display panel, a fabrication method of a display panel, and a display device. A first light-emitting layer may be introduced to irradiate the metal compound generated in the first bezel area to facilitate to decompose the metal compound. Accordingly, the issue that the accumulation of the metal compound causes the short circuit issue between the first lead and the second lead may be avoided, and the display reliability of the display panel and the display device may be improved.

The detailed description will be given below in conjunction with the drawings and specific embodiments.

Figure 2:
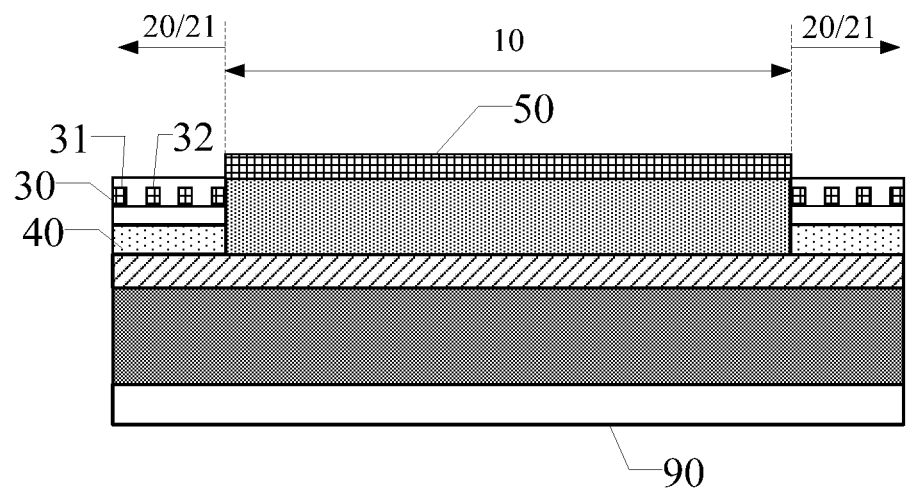
FIG. 2 illustrates an exemplary AA-sectional view in FIG. 1 consistent with various disclosed embodiments of the present disclosure.

FIG. 1 illustrates a top view of an exemplary display panel provided consistent with various disclosed embodiments of the present disclosure. FIG. 2 is an AA-sectional view of the display panel in FIG. 1.

As shown in FIG. 1 and FIG. 2, a display panel 100 is provided. The display panel 100 may have a display area 10 and a non-display area 20 surrounding the display area 10. The non-display area 20 may include a first bezel area 21.

Further, the display panel 100 may include a substrate 90, and a wiring layer 30 disposed on the substrate 90. The wiring layer 30 may be located in the non-display area 20.

The wiring layer 30 may include at least one first lead 31 and at least one second lead 32. A potential difference may be formed between the first lead 31 and the second lead 32. At least a partial line segment of the first lead 31 and at least a partial line segment of the second lead 32 may be located in the first frame area 21.

Further, the display panel 100 may include a polarizer 50 disposed on the side of the wiring layer 30 away from the substrate 90; and a first light-emitting layer 40 at least distributed in the first frame area 21. Along the direction perpendicular to a top surface of the substrate 90, the first light-emitting layer 40 may be disposed between the substrate 90 and the wiring layer 30.

It should be noted that FIG. 1 only uses a rectangular display panel 100 as an example to illustrate the structure of the display panel 100. In some other embodiments of the present disclosure, the display panel 100 may also be a circular, or an irregular structure. The shape of the display panel is not limited in the present disclosure. To clearly reflect the structure of the present disclosure, FIGS. 1-2 also only take one side of the first bezel area 21 including only 4 leads as an example for illustration. In fact, the first bezel area 21 may contain more than 4 leads. In addition, FIG. 2 only illustrates the relative positional relationship between the various film layers, and does not represent the actual film thickness. Moreover, FIG. 2 only illustrates the film layers between the substrate 90 and the first light-emitting layer 40. The indication does not represent the actual film structure, and the specific film structure will be described in the following content.

In particular, in the display panel 100 provided by the present disclosure, a wiring layer 30 is disposed in the non-display area 20, and the wiring layer 30 may include at least one first lead 31 and at least one second lead 32. The signals transmitted by the first lead 31 and the second lead 32 may be different, and a potential difference may be formed between the two leads. As a result, an electric field may be generated between the two leads. In the present disclosure, the polarizer 50 may be disposed on the side of the wiring layer 30 away from the substrate 90. In particular, the first light-emitting layer 40 may be introduced at least in the first bezel area 21, and may be disposed between the substrate 90 and the wiring layer 30. When water vapor invades the first bezel area 21, under the action of the electric field and the water vapor, in the material forming the first lead 31 and the second lead 32, active metal ions may be precipitated to form free positive ions. Under the action of water vapor, in the material forming the polarizer 50, negative ions may be precipitated. Positive ions and negative ions may synthesize a metal compound in the wiring layer 30 of the first bezel area 21. The first light-emitting layer 40 introduced in the first bezel area 21 may irradiate the metal compound to decompose the metal compound. Thus, the accumulation of the metal compound that may cause the short circuit issue between the first lead 31 and the second lead 32 may be avoided. Accordingly, the display reliability of the display panel 100 and the display device having the display panel 100 may be improved.

Assuming that the materials of the first lead 31 and the second lead 32 include Ag, and the material of the polarizer 50 includes I, when water vapor enters the first bezel region 21, under the action of the water vapor and the electric field formed there between the first lead 31 and the second lead 32, the metallic Ag in the first lead 31 and the second lead 32 is prone to have an ionized migration, and Ag+ ions may be precipitated. Under the action of the water vapor, the polarizer 50 may have precipitated I− ions in its boundary area. AgI may be synthesized when I− ions encounter Ag+ ions. When AgI accumulates in the first bezel area 21, it may be very likely that the first lead 31 and the second lead 32 will be short-circuited. In the present disclosure, the first light-emitting layer 40 may be introduced into the first bezel area 21, when the first light-emitting layer 40 emits light, the light may irradiate AgI in the first bezel area 21 to decompose AgI, and the accumulation of AgI in the first bezel area 21 may be effectively avoided. Thus, the short circuit phenomenon of the first lead 31 and the second lead 32 due to the accumulation of AgI may be significantly reduced, and the display reliability of the display panel 100 may be enhanced.

In one embodiment of the present disclosure, as shown in FIG. 2, the orthographic projection of the first lead 31 and the second lead 32 on the substrate 90 may be located within the orthographic projection range of the first light-emitting layer 40 on the substrate 90.

In particular, as shown in FIG. 2, considering that under the action of water vapor and an electric field, when the metal in the first lead 31 and the second lead 32 undergo the ionized migration, the precipitated active metal ions may be around in the first lead 31 and the second lead 32. When the active metal ions combine with the negative ions in the polarizer 50 to form a metal compound, the metal compound may also be located around the first lead 31 and the second lead 32. In the present disclosure, the orthographic projection of the first lead 31 and the second lead 32 on the substrate 90 may be set within the range of the orthographic projection of the first light-emitting layer 40 on the substrate 90. Thus, when the first light-emitting layer 40 emits light, the emitted light may be concentrated on the region having the first lead 31 and the second lead 32. The emitted light may reliably illuminate the metal compound around the first lead 31 and the second lead 32 to promote the reliable decomposition of the metal compound and prevent the metal compound from accumulating around the first lead 31 and the second lead 32. Thus, the short circuit phenomenon between the first lead 31 and the second lead 32 may be prevented.

In one embodiment, the first light-emitting layer 40 introduced in the present disclosure may cover the entire first bezel area 21 to realize the irradiation of the entire first bezel area 21. No matter where the metal compound formed by combining with the negative ions precipitated by the polarizer 50 and the positive ions precipitated from the first lead 31 and the second lead 32 is located in the first frame area, the metal compound may always be irradiated by the light emitted by the first light-emitting layer 40. Accordingly, the metal compound may always be reliably decomposed, and the possibility for the first lead 31 and the second lead 32 to have the short circuit phenomenon may be further reduced.

Figure 3:
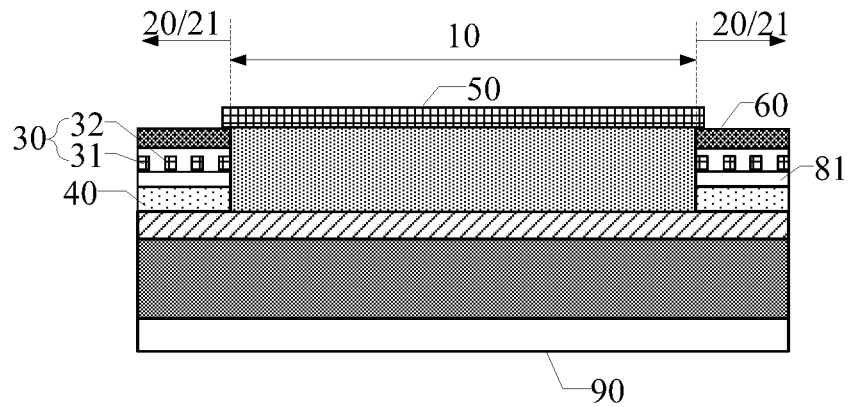
FIG. 3 illustrates another exemplary AA-sectional view in FIG. 1 consistent with various disclosed embodiments of the present disclosure.

FIG. 3 illustrates another AA-sectional view of the display panel 100 in FIG. 1. As shown in FIG. 3, in one embodiment, the display panel 100 may further include a light-shielding layer 60 disposed in the non-display area 20. The light-shielding layer 60 may be located on the side of the wiring layer 30 away from the substrate 90, and the orthographic projection of the light-shielding layer 60 on the substrate 90 may cover the orthographic projection of the first light-emitting layer 40 on the substrate 90.

In particular, referring to FIG. 3, the present disclosure introduces a light-shielding layer 60 on the side of the wiring layer 30 away from the substrate 90. The light-shielding layer 60 may be located in the non-display area 20, and its orthographic projection on the substrate 90 may cover the orthographic projection of the first light-emitting layer 40 on the substrate 90. For such a configuration, when the first light-emitting layer 40 emits light, the emitted light may be blocked by the light-shielding layer 60 to the side of the light-shielding layer 60 facing the substrate 90; and may not emit from the first bezel area 21. During the display process of the display device having the display panel 100, the display area 10 may perform an image display, and its bezel area may need to be kept at a black state without emitting light. The present disclosure may introduce the first light-emitting layer 40 in the first bezel area 21, and may further introduce the light-shielding layer 60, which may not only realize the irradiation of the metal compound in the first bezel area 21 by the first light-emitting layer 40, but also ensure the light emitted from the first light-emitting layer 40 light may not be emitted from the first bezel area 21. Thus, the non-display area 20 of the display device may be kept at the black state, and the adverse effect of the first light-emitting layer 40 to the normal display of the display device may be avoided.

In one embodiment of the present disclosure, referring to FIG. 3, the orthographic projection of the light-shielding layer 60 on the substrate 90 may cover the edge of the orthographic projection of the polarizer 50 on the substrate 90.

In particular, FIG. 3 also illustrates a relative positional relationship between the polarizer 50 and the light-shielding layer 60 located in the first bezel area 21. The polarizer 50 may cover the entire display area 10 of the display panel 100. When the light-shielding layer 60 is not introduced into the display area 20, a portion of the light emitted from the display area 10 of the display panel 100 may be directed to the edge of the polarizer 50 and emit from the edge of the polarizer 50. Thus, there may be a light leakage occurring at the edge of the polarizer 50. In the present disclosure, a light-shielding layer 60 may be introduced in the non-display area 20, and the edge of the polarizer 50 may extend into the non-display area 20. In particular, the orthographic projection of the edge of the polarizer 50 extending to the non-display area 20 on the substrate 90 may be within the orthographic projection of the light-shielding layer 60 on the substrate 90. Thus, when the light emitted from the display area 10 of the display panel 100 is directed to the edge of the polarizer 50, this portion of the light may be shielded by the light-shielding layer 60. Such a shielding may be equivalent to blocking the transmission path of the light from the display area 10 to the edge of the polarizer 50. Thus, it may facilitate to prevent the light emitted from the display area 10 of the display panel 100 from leaking at the edge of the polarizer 50; and the display effect of the display panel 100 may be improved.

Figure 4:
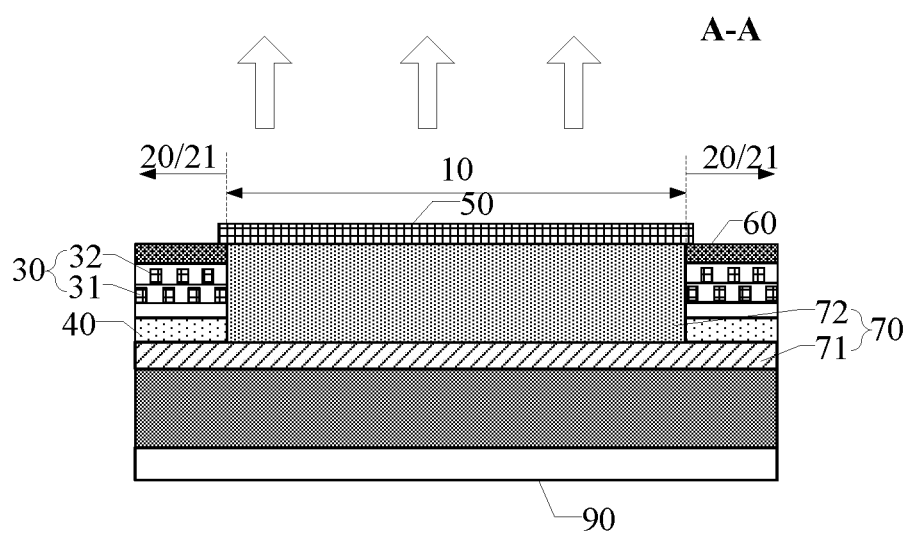
FIG. 4 illustrates another exemplary AA-sectional view in FIG. 1 consistent with various disclosed embodiments of the present disclosure.

The embodiments illustrated in FIGS. 2-3 show the situation where the first lead 31 and the second lead 32 in the wiring layer 30 are arranged in the same layer. In some embodiments of the present disclosure, the first lead and the second lead may be disposed on the different layers. FIG. 4 illustrates another exemplary AA-sectional view of the display panel 100 in FIG. 1. As shown in FIG. 4, at least a portion of the first lead 31 and at least a portion of the second lead 32 may be disposed on different layers.

In particular, FIG. 4 illustrates a situation where at least a portion of the first lead 31 and at least a portion of the second lead 32 in the wiring layer 30 may be arranged in different layers. When at least a portion of the first lead 31 and at least a portion of the second lead 32 are arranged in different layers, it may be beneficial to reduce the space occupied by the first lead 31 and the second lead 32 in the non-display area 20. Thus, it may be beneficial to realize the narrow bezel design of the display panel 100. Further, when the at least portion of the first lead 31 and the at least portion of the second lead 32 are arranged in different layers, it may also be beneficial to increase the distance between the adjacent first lead 31 and the second lead 32 along the direction perpendicular to the substrate 90. When the distance between the first lead 31 and the second lead 32 along perpendicular to the base substrate 90 is increased, the coupling capacitance between the two leads may be decreased, which may be beneficial to reduce the electric field strength between the first lead 31 and the second lead 32. When water vapor penetrates into the non-display area 20, the reduced electric field strength may also be beneficial to reduce the degree of the ionized migration of the first lead 31 and the second lead 32, and may be beneficial to reduce the amount the metal compound formed by the combination of the positive ions from the precipitation of the first lead 31 and the second lead 32 and the negative ions precipitated by the polarizer 50. Thus, the first light-emitting layer 40 may decompose the metal compound through less irradiation time; and the working time of the first light-emitting layer 40 may be reduced. Accordingly, the power consumption of the display panel 100 may be reduced.

In one embodiment, in the display panel 100 provided by the present disclosure, the first light-emitting layer 40 may be turned on to emit light regularly or irregularly to irradiate the wiring layer 30 of the non-display area 20. Because the first light-emitting layer 40 may have certain power consumption to emit light, the first light-emitting layer 40 may be turned on during the charging period or the standby period of the display panel 100 to prevent the screen display of the display panel 100 and the first light-emitting layer 40 from emitting light at the same time. Thus, the occurrence of an excessive power consumption of the display panel 100 may be avoided.

Figure 5:
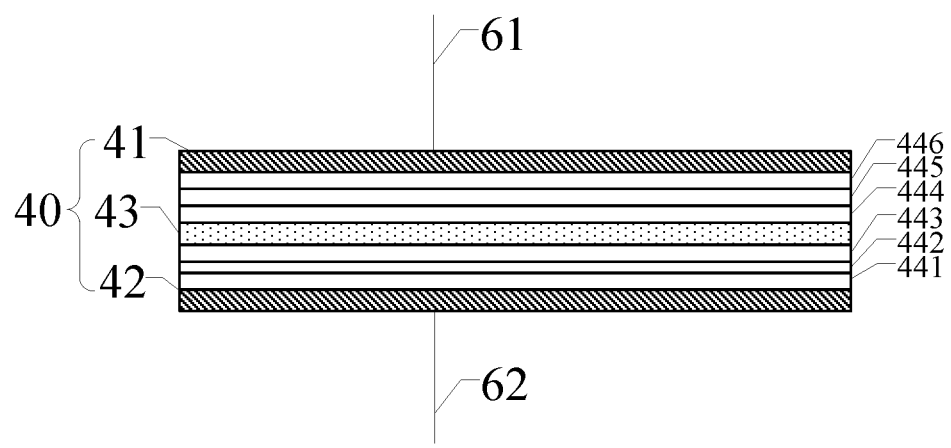
FIG. 5 illustrates a first light-emitting layer of an exemplary display panel consistent with various disclosed embodiments of the present disclosure.

FIG. 5 illustrates a schematic diagram of an exemplary first light-emitting layer 40 in the display panel 100 consistent with various disclosed embodiments of the present disclosure. As shown in FIG. 5, in one embodiment, the first light-emitting layer 40 may include a light-emitting material layer 43, a first electrode layer 41 and a second electrode layer 42. Along a direction perpendicular to the substrate 90, the light-emitting material layer 43 may be disposed between the first electrode layer 41 and the second electrode layer 42.

The display panel 100 may further include a first signal line 61 and a second signal line 62. The first signal line 61 may be electrically connected to the first electrode layer 41, and the second signal line 62 may be electrically connected to the second electrode layer 42.

In particular, referring to FIG. 5, the first light-emitting layer 40 provided by the embodiment of the present disclosure may include a light-emitting material layer 43, a first electrode layer 41 and a second electrode layer 42. The first electrode layer 41 and the first signal line 61 may be electrically connected together, and the second electrode layer 42 may be electrically connected to the second signal line 62. The first signal line 61 and the second signal line 62 may be configured to provide different electrical signals to the first electrode layer 41 and the second electrode layer 42, respectively, to excite the light-emitting material to emit light. The light-emitting material layer 43 may be embodied as an integral structure, and a voltage may be applied on the light-emitting material through the first signal line 61 and the second signal line 62 to achieve the light emission. Such a structure may be simple, and may be easy to implement. It should be noted that FIG. 5 only illustrates the first signal line 61 and the second signal line 62, and may not represent the actual structure of the first signal line 61 and the second signal line 62.

In one embodiment of the present disclosure, the first light-emitting layer 40 may further includes one or more of a hole injection layer 441, a hole transport layer 442, an electron barrier layer 443 a hole barrier layer 444, an electron transport layer 445, or an electron injection layer 446, as illustrated in FIG. 5. Driven by the voltage provided by the first signal line 61 and the second signal line 62, holes and electrons may be respectively injected from the first electrode and the second electrode into the light-emitting material layer 43. The light-emitting material may be an, for example, organic light-emitting material. The injected holes and electrons migrate from the hole transport layer and the electron transport layer to the light-emitting material layer 43. The holes and electrons may meet in the light-emitting material layer 43 and excitons may be generated. The excitons may transfer energy to the organic light-emitting molecules in the organic light-emitting material under the function of the electric field, and excite electrons in the organic light-emitting molecules to transit from the ground state to the excited state. When the electrons return from the excited state to the ground state by a radiation transition, the first light-emitting layer 40 may emit light.

Figure 6:
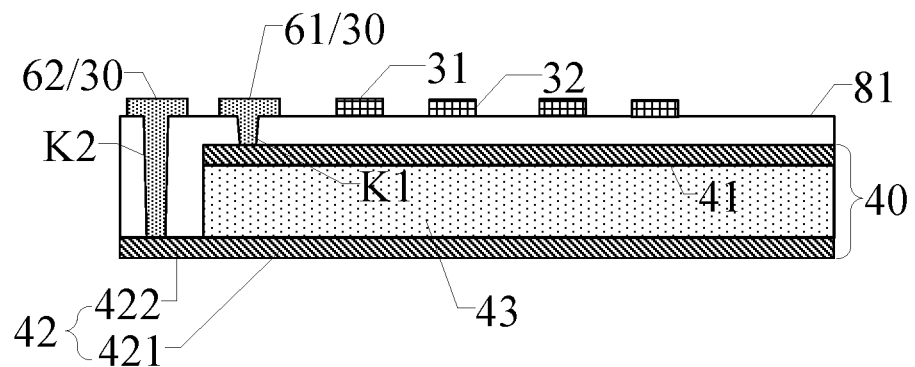
FIG. 6 illustrates a positional relationship of the first light-emitting layer and the wiring layer of an exemplary display panel consistent with various disclosed embodiments of the present disclosure.

FIG. 6 illustrates an exemplary relative positional relationship between the first light-emitting layer 40 and the wiring layer 30 in the display panel 100 provided by the present disclosure. As shown in FIG. 6, in one embodiment, the first signal line 61 and the second signal line 62 may both be disposed on the wiring layer 30. The display panel 100 may further include a first light-transmitting layer 81 disposed in the non-display area 20, and along a direction perpendicular to the substrate 90, the first light-transmitting layer 81 may be located between the wiring layer 30 and the first light-emitting layer 40.

The first light-transmitting layer 81 may include at least one first conductive via K1 and at least one second conductive via K2. The first conductive via K1 and the second conductive via K2 may at least pass through the first light-transmitting layer 81 along a direction perpendicular to the substrate 90. The first signal line 61 and the first electrode layer 41 may be electrically connected to each other through the first conductive via K1, and the second signal line 62 and the second electrode layer 42 may be electrically connected to each other through the second conductive via K2.

In particular, referring to FIG. 6, in the display panel 100 provided by the embodiment of the present disclosure, the first signal line 61 and the second signal line 62 that are electrically connected to the first electrode layer 41 and the second electrode layer 42 respectively may be disposed in the wiring layer 30, and may multiplex the wiring layer 30 in the non-display area, and it may not need to introduce a separately provided new film structure for the first signal line 61 and the second signal line 62. Thus, the manufacturing process of the display panel 100 may be simplified, and the production efficiency of the display panel 100 may be improved. Further, in the present disclosure, the first light-transmitting layer 81 may be disposed between the wiring layer 30 and the first light-emitting layer 40. The first light-transmitting layer 81 may be configured to isolate the first light-emitting layer 40 and the wiring layer 30. At the same time, the first light-transmitting layer 81 may also not affect the light emitted from the first light-emitting layer 40 to the wiring layer 30 to ensure that the light emitted by the first light-emitting layer 40 may irradiate the wiring layer 30.

In one embodiment of the present disclosure, referring to FIG. 6, the first electrode layer 41 may be disposed on the side of the second electrode layer 42 adjacent to the first light-transmitting layer 81. The second electrode layer 42 may include a main portion 421 and an extension portion 422 electrically connected to the main portion 421. The orthographic projection of the main portion 421 on the substrate 90 may overlap with the light-emitting material layer 43 and the first electrode layer 41. The orthographic projection of the extension portion 422 on the substrate 90 may not overlap both the light-emitting material layer 43 and the first electrode layer 41. The extension portion 422 may be electrically connected to the second signal line 62 through the second conductive via K2.

In particular, in the embodiment shown in FIG. 6, the orthographic projection of the light-emitting material layer 43 on the substrate 90 may be located within the orthographic projection of the second electrode layer 42 on the substrate 90. The second electrode layer 42 may include the main portion 421 having the orthographic projection overlapping with the light-emitting material layer 43; and may also include the extension portion 422 with the orthographic projection not overlapping with the light-emitting material layer 43. The main portion 421 and the extension portion 422 may be connected to each other and may be integrally formed. The extension portion 422 may be electrically connected to the second signal line 62 through the second conductive via K2, and the second signal line 62 may transmit electrical signal to the main portion 421 of the second electrode layer 42 through the second conductive via K2 and the extension portion 422 of the second electrode layer 42. Therefore, the second signal line 62 and the first signal line 61 may jointly control the light-emitting of the first light-emitting layer 40. FIG. 6 only illustrates a connection relationship between the first electrode layer 41 and the first signal line 61, and the second electrode layer 42 and the second signal line 62.

In some other embodiments of the present disclosure, the first electrode layer 41 and the first signal line 61, and the second electrode layer 42 and the second signal line 62 may also adopt other feasible connection methods, which are not specifically limited in this disclosure. Further, FIG. 6 also only shows the case where the first signal line 61 and the second signal line 62 are disposed in the same layer. In some other embodiments of the present disclosure, the first signal line 61 and the second signal line 62 may also be disposed on different film layers to realize the narrow bezel design of the display panel 100.

Figure 7:
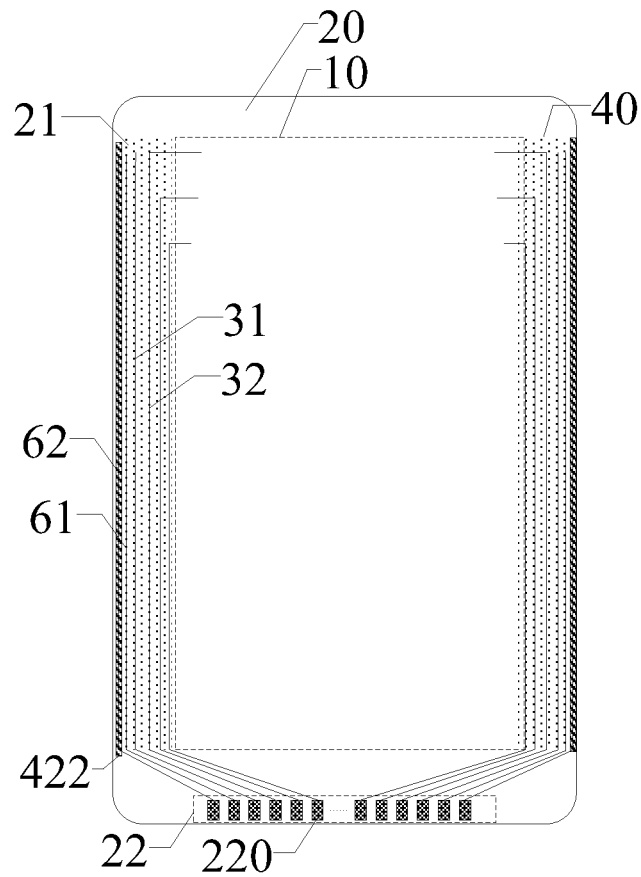
FIG. 7 illustrates a top view of another exemplary display panel consistent with various disclosed embodiments of the present disclosure.

FIG. 7 illustrates a top view of another exemplary display panel 100 consistent with various disclosed embodiments of the present disclosure. As shown in FIG. 6 and FIG. 7, the non-display area 20 may also include a bonding area 22. The bonding area 22 may be adjacent to the first frame area 21. The bonding area 22 may include a plurality of conductive pads 220. The first lead 31, the second lead 32, the first signal line 61, and the second signal line 62 may be electrically connected to different conductive pads 220, respectively.

In particular, referring to FIGS. 6-7, taking the display panel 100 with a rectangular structure as an example, when the bonding area 22 is disposed in the lower bezel area of the display panel 100, the first bezel area 21 is the bezel area adjacent to the lower bezel area where the bonding area 22 is located. The bonding area 22 in the present disclosure may be configured to bond with a control chip, and may also be used to bond with a flexible circuit board, such as FPC, etc. Further, a plurality of conductive pads 220 may be disposed in the bonding area 22. The first lead 31, the second lead 32, the first signal line 61, and the second signal line 62 may be electrically connected to different conductive pads 220, respectively. When the bonding area 22 is bonded to the control chip, the control chip may provide different signals to each signal line through different conductive pads 220.

In one embodiment of the present disclosure, referring to FIG. 7, the orthographic projection of the bonding area 22 on the substrate 90 and the orthographic projections of the first light-emitting layer 40 and the polarizer 50 (not shown in FIG. 7) on the substrate 90 may not overlap with each other. In particular, the first light-emitting layer 40 and the polarizer 50 may not be disposed in the bonding area 22. Generally, the bonding area 22 is used to bond with the control chip or FPC. When the first light-emitting layer 40 and the polarizer 50 are disposed in the non-display area 20 outside the bonding area 22, the first light-emitting layer 40 and the polarizer 50 may be ensured not to affect the bonding of components that are to-be-bounded in the bonding area 22 (for example, a control chip, or FPC).

Figure 8:
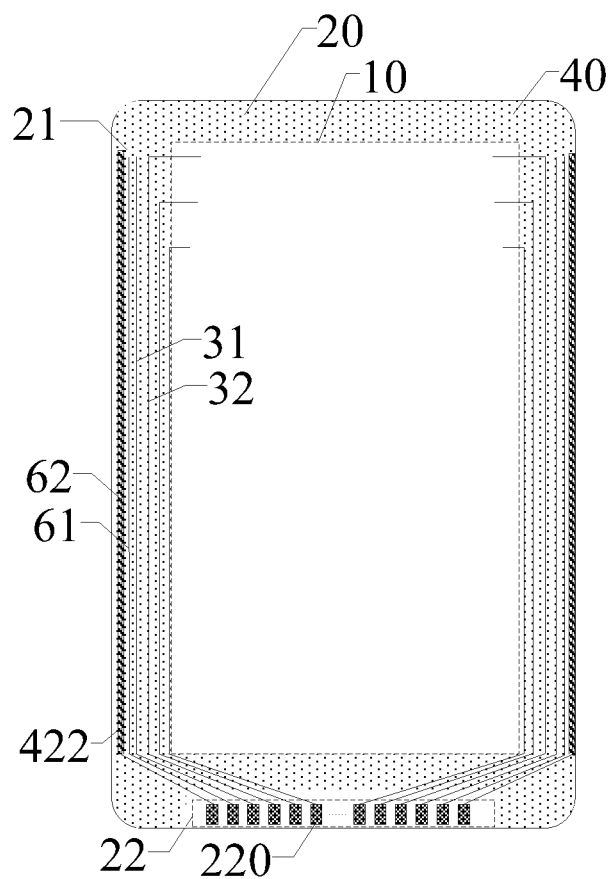
FIG. 8 illustrates a top view of another exemplary display panel consistent with various disclosed embodiments of the present disclosure.

In the embodiments illustrated in FIGS. 1-7, the first light-emitting layer 40 may be disposed in the first bezel area 21. FIG. 8 illustrates a top view of another exemplary display panel 100 consistent with various disclosed embodiments of the present disclosure. In some embodiments of the present disclosure, as shown in FIG. 8, the first light-emitting layer 40 may be disposed to surround the display area 10.

In particular, referring to FIG. 8, the first light-emitting layer 40 may be embodied as a ring structure disposed around the display area 10. In such a configuration, the orthographic projection of the first light-emitting layer 40 on the substrate 90 may overlap with the orthographic projections of the signal lines disposed in the non-display area 20 on the substrate 90. In particular, the first light-emitting layer 40 may irradiate more signal lines on the wiring layer 30 in the non-display area 20. Accordingly, it may be more beneficial to avoid the short circuits of the signal lines in different areas of the non-display area 20 caused by the voltage difference and water vapor. Thus, the display reliability of the display panel 100 may be enhanced.

Figure 9:
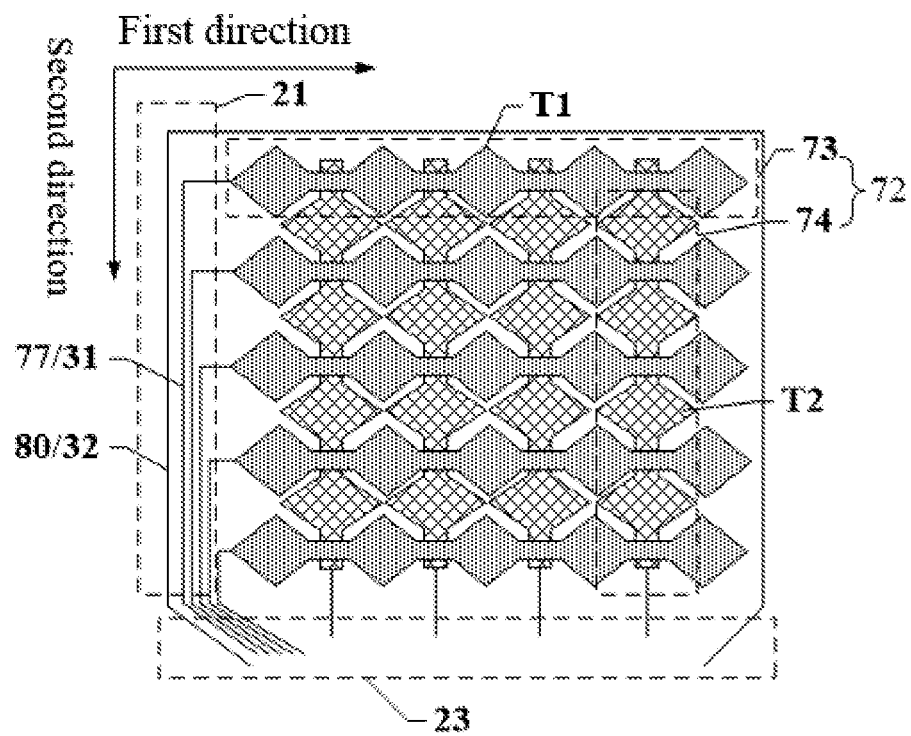
FIG. 9 illustrates a top view of exemplary touch electrodes consistent with various disclosed embodiments of the present disclosure.

FIG. 9 illustrates a top view of touch electrodes of an exemplary display panel consistent with various disclosed embodiments of the present disclosure. As shown in FIG. 4 and FIG. 9, in one embodiment of the present disclosure, the display panel 100 may further include a touch electrode layer 70 disposed on a side of the substrate 90 facing the light-existing surface of the display panel 100. The touch electrode layer 70 may include a touch electrode substrate 71 and a plurality of touch electrodes 72 disposed on the side of the touch electrode substrate 71 away from the substrate 90. The touch electrodes 72 may be disposed in the display area 10, and the touch electrodes 72 may be electrically connected to touch leads 77 of the first lead 31.

It should be noted that the light-exiting direction of the display panel is marked in the form of an arrow in FIG. 4, and the cross-sectional view of FIG. 4 only illustrates the touch electrodes 72, and may not represent the actual structure of the touch electrode. The top view of the touch electrodes 72 is illustrated in FIG. 9.

Referring to FIG. 4 and FIG. 9, the display panel 100 may further include a fixed-level signal line 80 disposed in the non-display area 20. In particular, the first lead 31 may include the touch lead 77, and the second lead 32 may include the fixed level signal line 80.

In particular, referring to FIG. 4 and FIG. 9, the display panel 100 provided by the present disclosure may include a touch electrode layer 70. The touch electrode layer 70 may include a touch electrode substrate 71 and a plurality of touch electrodes 72 disposed on the touch electrode substrate 71. The touch electrode 72 may be electrically connected to the touch lead 77, and the touch signal is transmitted through the touch lead 77. The display panel 100 provided by the present disclosure may further include a fixed-level signal line 80 disposed in the non-display area 20. The fixed-level signal line 80 may be, for example, a grounded line configured to conduct static electricity on the display panel 100 to the outside of the display panel 100 to prevent the static electricity from affecting the display panel 100.

It can be understood that the signal on the fixed-level signal line 80 in the display panel 100 and the touch signal on the touch lead 77 may be completely different signals, and there may be a certain voltage difference between the two signal lines. The first lead 31 mentioned in the above embodiments may include the above-mentioned touch lead 77, and the second lead 32 may include the above-mentioned fixed-level signal line 80. When the first light-emitting layer 40 is introduced to irradiate the touch lead 77 and the fixed-level signal line 80 in the wiring layer 30, the metal compound formed between the touch lead 77 and the fixed-level signal line 80 due to the action of the electric field and water vapor may be decomposed. Thus, the short-circuit phenomenon occurring between the touch lead 77 and the fixed-level signal line 80 because of the accumulation of the metal compound may be avoided. Thus, it may be beneficial to improve the touch performance and electrostatic discharge capability of the display panel 100.

It should be noted that FIG. 9 only shows a top view of the first touch electrode 73 and the second touch electrode 74. In the actual film structure, the first touch electrode 73 and the second touch electrode 74 may also be disposed in different film layers, and separated by an insulating layer.

It can be understood that the first lead 31 and the second lead 32 mentioned in the embodiment of the present disclosure are not only embodied as the above-mentioned touch lead 77 and fixed-level signal line 80, but can also be embodied as other signal lines in the wiring layer 30 with voltage differences. When the first light-emitting layer 40 in the present disclosure is used to illuminate the wiring layer 30, the metal compound formed between any two signal lines with the voltage difference in the wiring layer 30 may be decomposed under the irradiation of the light emitted by the light-emitting layer 40. Accordingly, the accumulation of metal compound formed between any two adjacent signal lines with a voltage difference may be avoided; and the corresponding short circuit issue between the two signal lines may be prevented.

In one embodiment of the present disclosure, referring to FIG. 4, when the display panel 100 includes the touch electrode layer 70, the wiring layer 30 provided by the present disclosure may be located on the side of the touch electrode substrate 71 in the touch electrode layer 70 away from the substrate 90, and the first light-emitting layer 40 may be located between the touch electrode substrate 71 and the wiring layer 30.

In particular, referring to FIG. 4 and FIG. 9, when the display panel 100 includes the touch electrode layer 70, at least a portion of the touch lead 77 may be laid out in the first bezel area 21. When the first bezel area 21 may also include other signals lines, for example, the fixed-level signal line 80, there may be a voltage difference between the touch lead 77 and the fixed-level signal line 80. Thus, a short circuit may occur. In the present disclosure, when the first light-emitting layer 40 is disposed between the touch electrode substrate 71 in the touch electrode layer 70 and the wiring layer 30, the first light-emitting layer 40 may irradiate the touch lead 77 and the fixed-level signal line 80 in the wiring layer 30. Thus, the metal compound formed between the touch lead 77 and the fixed-level signal line 80 may be decomposed by light, and the occurrence of a short circuit between the touch lead 77 and the fixed-level signal line 80 may be avoided.

It is understandable that when the first light-emitting layer 40 is disposed on the side of the touch electrode substrate 71 of the touch electrode layer 70 away from the substrate 90 in the present disclosure, the space between the touch electrode base 71 of the touch electrode layer 70 and the wiring layer 30 may be used to dispose the first light-emitting layer 40. Thus, it may not require increasing the thickness of the display panel 100. Accordingly, the introduction of the first light-emitting layer 40 may not affect the overall thickness of the display panel 100.

Figure 10:
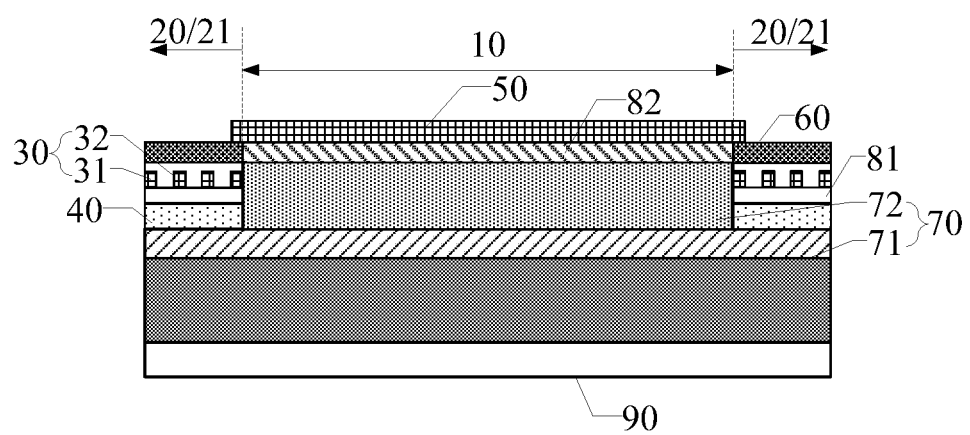
FIG. 10 illustrates another exemplary AA-sectional view in FIG. 1 consistent with various disclosed embodiments of the present disclosure.

FIG. 10 illustrates another AA-sectional view of the display panel 100 in FIG. 1. As shown in FIG. 10, the display panel 100 may further include a second light-transmitting layer 82. The second light-transmitting layer 82 may be disposed on a side of the touch electrode 72 away from the substrate 90, and the orthographic projection of the second light-transmitting layer 82 on the substrate 90 may coincide with the display area 10.

In particular, a second light-transmitting layer 82 may be disposed on the side of the touch electrode 72 away from the substrate 90, and the second light-transmitting layer 82 may cover the touch electrode 72, and may protect the touch electrode 72. At the same time, because the second light-transmitting layer 82 may have a light-transmitting function, it may not block the image display of the display panel 100, and may not affect the normal display function of the display panel 100.

In one embodiment, when the second light-transmitting layer 82 is introduced in the display panel 100, the surface of the second light-transmitting layer 82 away from the surface of the substrate 90 and the surface of the light-shielding layer 60 in the non-display area 20 away from the surface of the substrate 90 may be on a same plane. Thus, a flattened surface may be provided for the attachment of the polarizer 50, and it may be beneficial to simplify the assembly difficulty of the display panel 100.

In one embodiment of the present disclosure, referring to FIG. 9, the touch electrode 72 may include a plurality of first touch electrodes 73 arranged along a second direction and a plurality of second touch electrodes 74 arranged along a first direction. The first direction may intersect the second direction. One first touch electrode 73 may include a plurality of electrically connected first sub-electrodes T1, and one second touch electrode 74 may include a plurality of electrically connected second sub-electrodes T2. All first sub-electrodes T1 in a same first touch electrode 73 may be arranged along the first direction and all the second sub-electrodes T2 in a same second touch electrode 74 may be arranged along the second direction.

The non-display area 20 may further include a second bezel area 23 adjacent to the first bezel area 21. At least the touch leads 77 electrically connected to the first touch electrodes 73 may be disposed in the first bezel area 21 and the second bezel area 23 at the same time.

In particular, FIG. 9 illustrates a structure in which the touch electrode 72 in the touch electrode layer 70 is a touch electrode in the form of mutual capacitance. The touch electrode 72 may include a plurality of first touch electrodes 73 and a plurality of second touch electrodes 74. In the viewing angle shown in FIG. 9, each first sub-electrode T1 in a first touch electrode 73 may electrically connected to each other to form an electrode row extending along the first direction, and each second sub-electrode T2 in a second touch electrode 74 may be electrically connected to each other to form an electrode column extending in the second direction. In the touch phase, one of the first touch electrode 73 and the second touch electrode 74 may receive a touch detection signal through the touch lead 77, and the other may sense the external touch, and feedback the touch sensing signal to a control chip through the touch lead 77 electrically connected with the first touch electrode 73 or the second touch electrode 74. In the present disclosure, the touch leads 77 electrically connected to the first touch electrodes 73 may be laid out in the first bezel area 21 and the second bezel area 23 to realize the electrical connection between the first touch electrodes 73 and the touch control chip. When the wiring layer 30 may further include a fixed-level signal line 80, a portion of the line segment of the fixed-level signal line 80 may also be disposed in the first bezel area 21 and the second bezel area 23, and the fixed-level signal may be obtained through the touch control chip. In view of the situation that the touch lead 77 and the fixed-level signal line 80 are located in the first bezel area 21 and the second bezel area 23 at the same time, the first light-emitting layer 40 may be at least disposed in the first bezel area 21 and the second bezel area 23, or may be disposed as a ring surrounding the entire display area 10. In such a configuration, any two signal lines with a voltage difference located around the display area 10 may be illuminated by the first light-emitting layer 40. Thus, the short circuit issue between the signal lines with different signals in the surrounding area of the display area 10 may be avoided.

Figure 11:
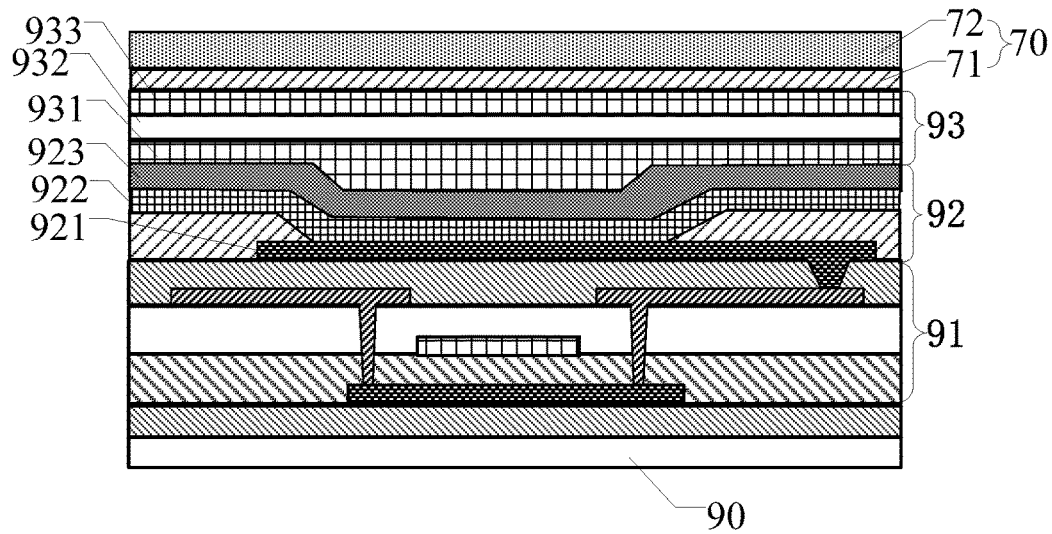
FIG. 11 illustrates an exemplary BB-sectional view in FIG. 1 consistent with various disclosed embodiments of the present disclosure.

FIG. 11 illustrates a BB-sectional view of the display panel 100 in FIG. 1. As shown in FIG. 4 and FIG. 11, along the direction perpendicular to the substrate 90, the display panel 100 may also include an array layer 91, a second light-emitting layer 92, and an encapsulation layer 93, disposed between the substrate 90 and the touch electrode layer 70. The second light-emitting layer 92 may be disposed between the array layer 91 and the encapsulation layer 90.

In particular, FIG. 11 shows a schematic diagram of a structure of the film layers disposed between the substrate 90 and the touch electrode layer 70 in the display panel 100. As shown in FIG. 11 and FIG. 4, in one embodiment, the display panel 100 provided by the present disclosure may be an organic light-emitting display panel. An array layer 91, a second light-emitting layer 92 and an encapsulation layer 93 may be disposed between the substrate 90 and the touch electrode layer 70. The array layer 91 may be electrically connected to the second light-emitting layer 92 to provide the driving signal for the second light-emitting layer 92. The encapsulation layer 93 may cover the side of the second light-emitting layer 92 away from the substrate 90, and may be configured to package the second light-emitting layer 92. It should be noted that the second light-emitting layer 92 of the present disclosure may include, for example, an anode layer 921, an organic light-emitting material layer 922, and a cathode layer 923. In some other embodiments of the present disclosure, the second light-emitting layer 92 may also include one or more of a hole injection layer, a hole transport layer, an electron barrier layer, a hole barrier layer, an electron transport layer, or an electron injection layer. In addition, the encapsulation layer 93 may include, for example, a first inorganic encapsulation layer 931, a first organic encapsulation layer 932, or a second inorganic encapsulation layer 933, etc., stacked together achieve a reliable packaging of the second light-emitting layer 92 in the display area 10 of the display panel 100 to prevent external water vapor and oxygen from invading the display area 10 and affecting the normal light-emission of the second light-emitting layer 92.

In the present disclosure, referring to FIG. 4 and FIG. 11, the touch electrode layer 70 may be disposed on the side of the encapsulation layer 93 away from the substrate 90. Under such a configuration, the touch electrode layer 70 in the display panel 100 may be embodied as an external structure. The first light-emitting layer 40 in this disclosure may be disposed on the side of the touch electrode substrate 71 in the external touch electrode layer 70 away from the substrate 90, and may not occupy the original film layer structure corresponding to the array layer 91, the second light-emitting layer 92 and the encapsulation layer 93 in the display panel 100. Thus, the array layer 91, the second light-emitting layer 92 and the encapsulation layer 93 in the display panel 100 may be formed in accordance with the conventional production processes. The first light-emitting layer 40 may be combined when the touch electrode layer 70 is subsequently produced. The introduction of the first light-emitting layer 40 may not affect the production process of the display functional layer (for example, including the array layer 91 and the second light-emitting layer 92, etc.) in the display panel 100. Thus, it may be beneficial to simplify the overall production process of the display panel 100 when the first light-emitting layer 40 is introduced.

Figure 12:
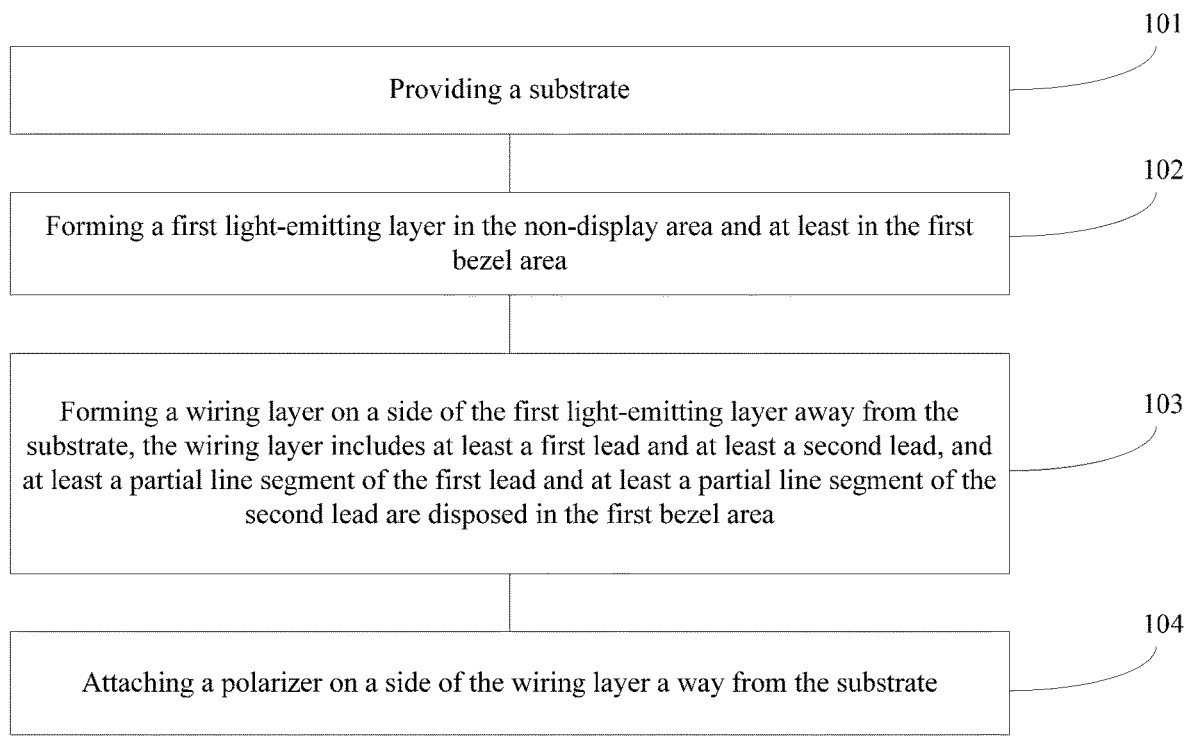
FIG. 12 illustrates a flow chart of an exemplary fabrication method of a display panel consistent with various disclosed embodiments of the present disclosure.

The present disclosure also provides a fabrication method of a display panel 100. FIG. 12 shows a flow chart of an exemplary fabrication method of the display panel 100 consistent with various disclosed embodiments of the present disclosure. The method may be to form any display panel 100 described in the previously described embodiments. As shown in FIG. 12, in one embodiment, the display panel 100 may include a display area 10 and a non-display area 20 surrounding the display area 10. The non-display area 20 may include a first bezel area 21. Referring to FIG. 1, FIG. 2 and FIG. 12, the fabrication method may include:

Step 101: providing a substrate 90;

Step 102: forming a first light-emitting layer 40 on the non-display area 20 of the substrate 90 such that the first light-emitting layer 40 may be distributed at least in the first bezel area 21;

Step 103: forming a wiring layer 30 on the side of the first light-emitting layer 40 away from the substrate 90. The wiring layer 30 may include at least one first lead 31 and at least one second lead 32. At least a portion of the line segment of the first lead 31 and at least a portion of the line segment of the second lead 32 may be located in the first bezel area 21; and Step 104: attaching a polarizer 50 on the side of the wiring layer 30 away from the substrate 90.

In particular, in the fabrication method of the display panel 100 provided in the present disclosure, the first light-emitting layer 40 may be formed in the non-display area 20 by the above step 102 such that the first light-emitting layer 40 may be distributed at least in the first Bezel area 21. Further, a wiring layer 30 may be formed on the side of the first light-emitting layer 40 away from the substrate 90. The wiring layer 30 may include at least two leads with different signals: a first lead 31 and a second lead 32, respectively. At least portions of the line segments of the first lead 31 and the second lead 32 may also be formed in the first bezel area 21. Finally, a polarizer 50 may be attached to the side of the wiring layer 30 away from the substrate 90.

In the display panel 100 formed by the above fabrication method, a wiring layer 30 may be provided in the non-display area 20, and the wiring layer 30 may include at least one first lead 31 and at least one second lead 32. The signals transmitted by the first lead 31 and the second lead 32 may be different, and a voltage difference may be formed between the two leads, and then an electric field may be formed. In the present disclosure, a polarizer 50 may be disposed on the side of the wiring layer 30 away from the substrate 90. In particular, the first light-emitting layer 40 may be introduced at least in the first bezel area 21, and the first light-emitting layer 40 may be disposed between the substrate 90 and the wiring layer 30. When water vapor invades the first bezel area 21, under the action of the electric field and water vapor, in the metal material forming the first lead 31 and the second lead 32, active metal ions may be precipitated to form free positive ions and; under the action of water vapor, negative ions may be precipitated in the material forming the polarizer 50. The positive ions and the negative ions may synthesize metal compound in the first bezel area 21. The first light-emitting layer 40 introduced in the first bezel area 21 of the present disclosure may irradiate the metal compound to decompose the metal compound. Thus, the accumulation of metal objects that may cause a short-circuit phenomenon between the first lead 31 and the second lead 32 may be avoided. Accordingly, the display reliability of the display panel 100 and the display device may be enhanced.

In one embodiment of the present disclosure, referring to FIG. 4, FIG. 11, and FIG. 12, the method for fabricating a display panel provided by the present disclosure may further includes sequentially stacking and fabricating an array layer 91, a second light-emitting layer 92 and an encapsulation layer 93 on the substrate 90. The second light-emitting layer 92 may be formed between the array layer 91 and the encapsulation layer 93. The second light-emitting layer 92 may be disposed in the display area 10. The encapsulation layer 93 may be disposed on a side of the second light-emitting layer 92 away from the substrate 90.

In particular, in the present disclosure, an array layer 91, a second light-emitting layer 92, and an encapsulation layer 93 may be sequentially formed on a substrate 90. The array layer 91 may be electrically connected to the second light-emitting layer 92 to provide driving signals for the second light-emitting layer 92. The encapsulation layer 93 may cover the side of the second light-emitting layer 92 away from the substrate 90 for encapsulating the second light-emitting layer 92. It should be noted that the second light-emitting layer 92 of the present disclosure may include, for example, an anode layer 921, an organic light-emitting material layer 922, and a cathode layer 923. In some other embodiments of the present disclosure, the second light-emitting layer 92 may also include one or more of a hole injection layer, a hole transport layer, an electron barrier layer, a hole barrier layer, an electron transport layer, or an electron injection layer. In addition, the encapsulation layer 93 may include, for example, stacked a first inorganic encapsulation layer 931, a first organic encapsulation layer 932, and a second inorganic encapsulation layer 933, etc., to achieve a reliable encapsulation effect on the second light-emitting layer 92 in the display area 10 of the display panel 100 and to prevent external water vapor and oxygen from invading the display area 10 and affecting the normal light emission of the second light-emitting layer 92. In the present disclosure, the first light-emitting layer 40 may be located on the side of the encapsulation layer 93 away from the substrate 90, and may not occupy the original film structure of the array layer 91, the second light-emitting layer 92, and the packaging layer 93 in the display panel 100. Thus, the array layer 91, the second light-emitting layer 92, and the encapsulation layer 93 of the display panel 100 may be fabricated according to the conventional production processes. Therefore, the introduction of the first light-emitting layer 40 may not affect the fabrication process of the display function layers of the display panel 100 (for example, the array layer 91 and the second light-emitting layer 92, etc.). Thus, it may be beneficial to simplify the overall fabrication process of the display panel 100 when the first light-emitting layer 40 is introduced.

In one embodiment of the present disclosure, referring to FIG. 4, FIG. 11, and FIG. 12, the method for fabricating the display panel 100 may further include the step of forming a touch electrode layer 70. The touch electrode layer 70 may include a touch electrode substrate 71 and a plurality of touch electrodes 72 disposed on a side of the touch electrode substrate 71 away from the substrate 90. The touch electrodes 72 may be disposed in the display area 10.

In particular, when forming the touch electrode layer 70 in the present disclosure, the touch electrode substrate 71 of the touch electrode layer 70 may be formed firstly, and then the touch electrodes 72 may be formed on the side of the touch electrode substrate 71 away from the substrate 90. It should be noted that the first light-emitting layer 40 may be directly formed on the touch electrode substrate 71 as a film, or may be formed separately and then disposed on the touch electrode substrate 71. The sequence for forming the first light-emitting layer is not specifically limited in the present disclosure. In addition, the sequence of the steps of fabricating the first light-emitting layer 40 on the touch electrode substrate 71 and the steps of fabricating the touch electrodes 72 can be operated according to actual needs, which is not specifically limited in the present disclosure. The first light-emitting layer 40 in the present disclosure may be disposed on the side of the touch electrode substrate 71 of the touch electrode layer 70 away from the substrate 90, and may not occupy the film layer structures corresponding to the array layer 91, the second light-emitting layer 92 and the encapsulation layer 93 of the original display panel 100. Thus, the normal fabrication process of the array layer 91, the second light-emitting layer 92 and the encapsulation layer 93 may not be affected.

Figure 13:
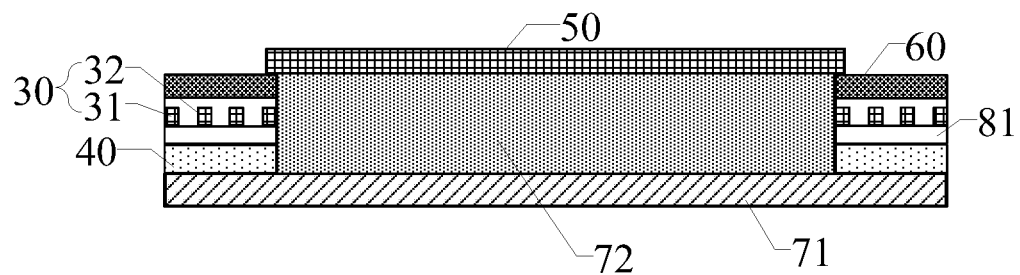
FIG. 13 illustrates an exemplary touch substrate formed by the disclosed fabrication method of a display panel consistent with various disclosed embodiments of the present disclosure.

It should be noted that in the fabrication method of the display panel provided by the present disclosure, the display panel may be fabricate by dividing the display panel into two parts. The two parts may be the touch substrate 100-1 and the display substrate 100-2. The structure of the touch substrate 100-1 may be referred to FIG. 13, and the structure of the display substrate 100-2 may be referred to FIG. 14. FIG. 13 shows a schematic diagram of a touch substrate formed by an exemplary fabrication method of a display panel provided by the present disclosure, and FIG. 14 shows a schematic diagram of a display substrate formed by an exemplary fabrication method of the display panel provided by the present disclosure.

Referring to FIG. 13, the fabrication method of the touch substrate 100-1 may include forming the first light-emitting layer 40, the wiring layer 30, the light shielding layer 60 and the touch electrodes 72 on the touch electrode substrate 71, respectively, and then a polarizer 50 may be attached to the side of the touch electrode 72 away from the touch electrode substrate 71. It should be noted that the touch electrode 72 may be formed before forming the first light-emitting layer 40, or it may be formed after forming the first light-emitting layer 40, which is not specifically limited in the present disclosure.

Figure 14:
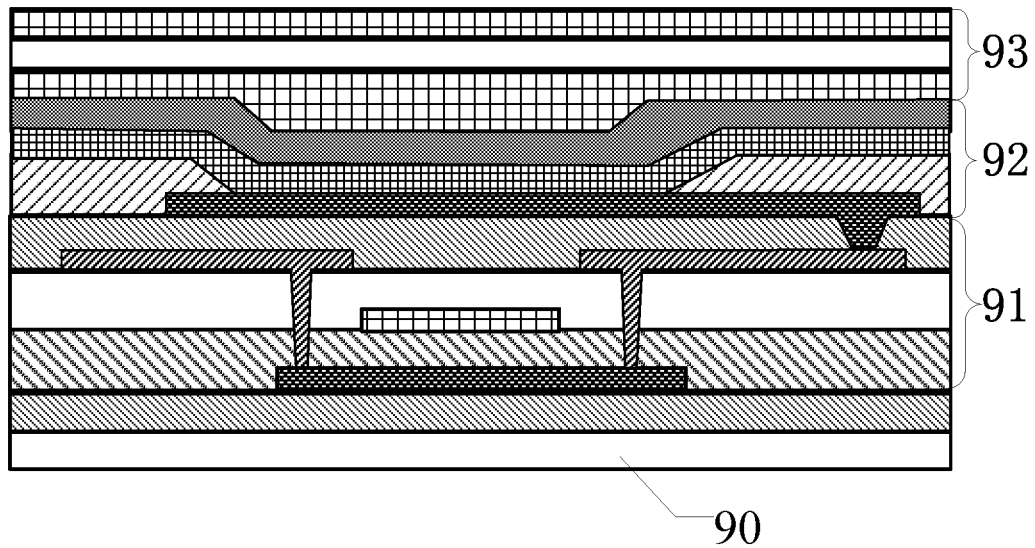
FIG. 14 illustrates an exemplary display substrate formed by the disclosed fabrication method of a display panel consistent with various disclosed embodiments of the present disclosure.

Further, referring to FIG. 14, the fabrication method of the display substrate 100-2 may include forming the array layer 91, the second light-emitting layer 92 and the encapsulation layer 93 on the substrate 90. It should be noted that there is no strict sequence between the fabrication of the touch substrate 100-1 and the fabrication of the display substrate 100-2. After forming the touch substrate 100-1 and the display substrate 100-2, respectively, the touch electrode substrate 71 of the touch substrate 100-1 may be attached on the encapsulation layer 93 of the display substrate 100-2. The display panel formed by such a method is a display panel with external touch electrodes.

In some embodiments of the present disclosure, after forming the display substrate 100-2, the touch electrode substrate 71 may be directly fabricated on the encapsulation layer 93, and then the first light-emitting layer 40, the wiring layer 30, the light-shielding layer 60, the touch electrodes 72 and the polarizer 50 may be fabricated on the touch electrode substrate 71.

Figure 15:
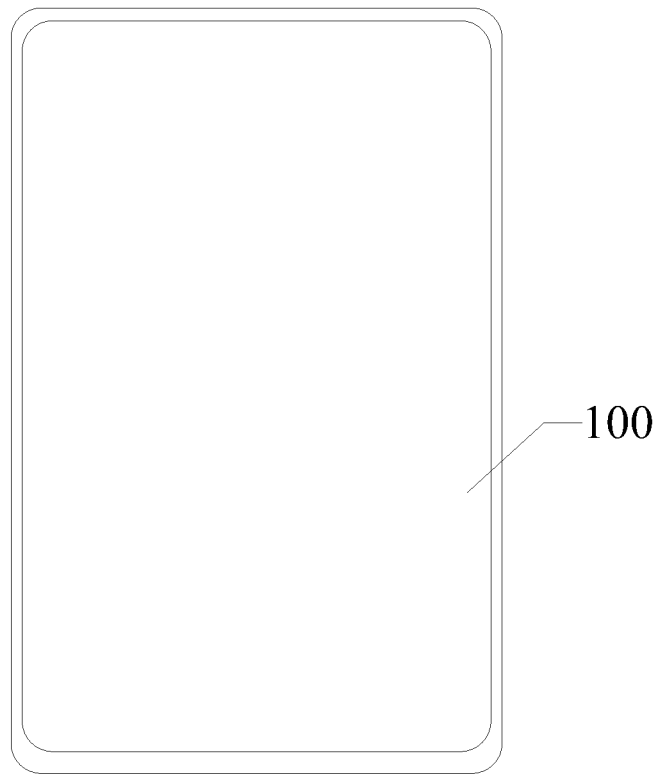
FIG. 15 illustrates an exemplary display device consistent with various disclosed embodiments of the present disclosure.

The present disclosure also provides a display device. FIG. 15 illustrates a structural diagram of an exemplary display device 200 consistent with various disclosed embodiments of the present disclosure. As shown in FIG. 15, the display device 200 may include a display panel 100. The display panel 100 may be a present disclosed display panel described in the previous disclosed embodiments. It should be noted that, for the embodiment of the display device 200 provided in the embodiment of the present disclosure, reference may be made to the embodiments of the above-mentioned display panel, and the repetitive parts will not be repeated. The display device 200 provided in the present disclosure may be be any product or component with a display function, such as a mobile phone, a tablet computer, a television, a monitor, a notebook computer, a digital photo frame, or a navigator, etc.

In summary, the display panel, the method for fabricating a display, and the display device provided by the present disclosure may achieve at least the following beneficial effect.

In the display panel, the fabrication method of the display panel, and the display device provided by the present disclosure, a wiring layer may be formed in the non-display area, and the wiring layer may include at least one first lead and at least one second lead. The transmitted signals may be different, and a voltage difference may be generated between the two leads; and thus an electric field may be generated. In the present disclosure, a polarizer is disposed on the side of the wiring layer away from the substrate. In particular, at least the first light-emitting layer may be disposed in the first bezel area, and the first light-emitting layer may be disposed between the substrate and the wiring layer. When water vapor invades the first bezel area, under the action of the electric field and water vapor, in the material forming the first lead and the second lead, active metal ions may be precipitated to form free positive ions. Under the action of water vapor, in the material forming the polarizer, negative ions may be precipitated. The positive ions and the negative ions may synthesize a metal compound in the first bezel area. The first light-emitting layer introduced in the first bezel area of the present disclosure may irradiate the metal compound to decompose the metal compound to prevent the accumulation of metal compound. Thus, the short circuit issue between the first lead and the second lead caused by the accumulation of the metal compound may be avoided. Accordingly, the display reliability of the display panel and the display device may be improved.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A display panel having a display area, and a non-display area surrounding the display area, a first bezel area being in the non-display area, and the display panel comprising:
   a substrate;
   a wiring layer, disposed on the substrate and in the non-display area, and including at least one first lead and at least one second lead, wherein a voltage difference is formed between the at least one first lead and the at least one second lead, and at least a partial line segment of the at least one first lead and at least a partial line segment of the at least one second lead are disposed in the first bezel area;
   a polarizer disposed on a side of the wiring layer away from the substrate; and
   a first light-emitting layer, at least distributed in the first bezel area and, along a direction perpendicular to the substrate, disposed between the substrate and the wiring layer.

2. The display panel according to claim 1, wherein:
an orthographic projection of the at least one first lead and an orthographic projection of the at least one second lead on the substrate are within an orthographic projection of the first light-emitting layer on the substrate.

3. The display panel according to claim 1, further comprising:
a light-shielding layer, disposed on the non-display area and on a side of the wiring layer away from the substrate,
wherein an orthographic projection of the light-shielding layer on the substrate covers the orthographic projection of the first light-emitting layer on the substrate.

4. The display panel according to claim 3, wherein:
the orthographic projection of the light-shielding layer on the substrate covers an edge of an orthographic projection of the polarizer on the substrate.

5. The display panel according to claim 1, wherein:
at least a portion of the at least one first lead and at least a portion of the at least one second lead are disposed on different layers.

6. The display panel according to claim 1, wherein:
the first light-emitting layer includes a light-emitting material layer, a first electrode layer and a second electrode layer;
along the direction perpendicular to the substrate, the light-emitting material layer is disposed between the first electrode layer and the second electrode layer;
the display panel further includes a first signal line and a second signal line;
the first signal line is electrically connected to the first electrode layer; and
the second signal line is electrically connected to the second electrode layer.

7. The display panel according to claim 6, wherein:
the first signal line and the second signal line are both disposed in the wiring layer;
the display panel also includes a first light-transmitting layer disposed in the non-display area;
along the direction perpendicular to the substrate, the first light-transmitting layer is disposed between the wiring layer and the first light-emitting layer;
the first light-transmitting layer includes at least one first conductive via and at least one second conductive via;
along the direction perpendicular to the substrate, the at least one first conductive via and the at least one second conductive via at least pass through the first light-transmitting layer;
the first signal line is electrically connected to the first electrode layer through the at least one first conductive via; and
the second signal line is electrically connected to the second electrode layer through the at least one second conductive via.

8. The display panel according to claim 7, wherein:
the first electrode layer is disposed on a side of the second electrode layer adjacent to the first light-transmitting layer;
the second electrode layer includes a main portion and an extension portion electrically connected to the main portion;
an orthographic projection of the main portion on the substrate overlaps with the light-emitting material layer and the first electrode layer;
an orthographic projection of the extension portion on the substrate does not overlap with the light-emitting material layer or the first electrode layer; and
the extension portion is electrically connected to the second signal line through the at least one second conductive via.

9. The display panel according to claim 6, wherein:
the first light-emitting layer further includes one or more of a hole injection layer, a hole transport layer, an electron barrier layer, a hole barrier layer, an electron transport layer, or an electron injection layer.

10. The display panel according to claim 6, wherein:
the non-display area also includes a bonding area;
the bonding area includes a plurality of conductive pads; and
the at least one first lead, the at least one second lead, the first signal line and the second signal line are electrically connected to different conductive pads of the plurality of conductive pads, respectively.

11. The display panel according to claim 10, wherein:
an orthographic projection of the bonding area on the substrate does not overlap with an orthographic projection of either the first light-emitting layer or an orthographic projection of the polarizer on the substrate.

12. The display panel according to claim 1, wherein:
the first light-emitting layer is disposed surrounding the display area.

13. The display panel according to claim 1, further comprising:
a touch electrode layer, disposed on a side of the substrate facing toward a light-exiting surface of the display panel,
wherein:
the touch electrode layer includes a touch electrode substrate and a plurality of touch electrodes disposed on a side of the touch electrode substrate away from the substrate;
the plurality of touch electrodes are disposed in the display area;
the plurality of touch electrodes includes a plurality of first touch electrodes each being electrically connected to a touch lead of the at least one first lead;
the display panel also includes a fixed-level signal line disposed in the non-display area;
the at least one first lead includes the touch lead; and
the at least one second lead includes the fixed-level signal line.

14. The display panel according to claim 13, wherein:
the wiring layer is disposed on a side of the touch electrode substrate away from the substrate; and
the first light-emitting layer is display between the substrate and the wiring layer.

15. The display panel according to claim 13, wherein:
the display panel also includes a second light-transmitting layer disposed on a side of the touch electrode layer away from the substrate; and
an orthographic projection of the second light-transmitting layer on the substrate coincides with the display area.

16. The display panel according to claim 13, wherein:
the plurality of touch electrodes further include a plurality of second touch electrodes;
one of the plurality of first touch electrodes includes a plurality of first sub-electrodes electrically connected to each other;
one of the plurality of second touch electrodes includes a plurality of second sub-electrodes electrically connected to each other;

all of the plurality of first sub-electrodes in a same first touch electrode are distributed along a first direction;
all of the plurality of second sub-electrodes in a same second touch electrode are distributed along a second direction;
the first direction intersects the second direction;
the non-display area also includes a second bezel area adjacent to the first bezel area; and
at least the touch lead electrically connected to the first touch electrode is disposed in the first bezel area and the second bezel area simultaneously.

17. The display panel according to claim 13, wherein:
along the direction perpendicular to the substrate, the display panel also includes an array layer, a second light-emitting layer and an encapsulation layer disposed between the substrate and the touch electrode layer;
the second light-emitting layer is disposed between the array layer and the encapsulation layer and in the display area; and
the array layer is disposed between the second light-emitting layer and the substrate.

18. A method for fabricating a display panel having a display area and a non-display area surrounding the display area, a first bezel area being in the non-display area, and the method comprising:
providing a substrate;
forming a first light-emitting layer in the non-display area and in at least the first bezel area;
forming a wiring layer on a side of the first light-emitting layer way from the substrate, wherein the first wring layer includes at least one first lead and at least one second lead, and at least a partial line segment of the at least one first lead and at least a partial line segment of the at least one second lead are disposed in the first bezel area; and
attaching a polarizer on a side of the wiring layer away from the substrate.

19. The method according to claim 18, further comprising:
sequentially forming an array layer, a second light-emitting layer and an encapsulation layer, stacked on the substrate,
wherein:
the second light-emitting layer is disposed between the array layer and the encapsulation layer and disposed in the display area; and
the encapsulation layer is disposed on a side of the second light-emitting layer away from the substrate.

20. The method according to claim 19, further comprising:
forming a touch electrode layer,
wherein the touch electrode layer includes a touch electrode substrate and a plurality of touch electrodes disposed on a side of the touch electrode substrate away from the substrate and in the display area.

21. The method according to claim 19, wherein:
the first light-emitting layer is disposed on the substrate and between the substrate and the wiring layer.

22. A display device, comprising:
a display panel,
wherein the display panel includes:
a display area, and a non-display area surrounding the display area, a first bezel area being in the non-display area;
a substrate;
a wiring layer, disposed on the substrate and in the non-display area, and including at least one first lead and at least one second lead, wherein a voltage difference is formed by between the at least one first lead and the at least one second lead, and at least a partial line segment of the at least one first lead and at least a partial line segment of the at least one second lead are disposed in the first bezel area;
a polarizer disposed on a side of the wiring layer away from the substrate; and
a first light-emitting layer, at least distributed on the first bezel area and, along a direction perpendicular to the substrate, disposed between the substrate and the wiring layer.

* * * * *